United States Patent
Katagiri et al.

(10) Patent No.: US 8,169,787 B2
(45) Date of Patent: May 1, 2012

(54) TERMINAL STRUCTURE OF AN ELECTRONIC COMPONENT

(75) Inventors: Yoshitaka Katagiri, Osaka (JP); Masanori Kitaguchi, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 257 days.

(21) Appl. No.: 12/610,767

(22) Filed: Nov. 2, 2009

(65) Prior Publication Data

US 2010/0124033 A1    May 20, 2010

(30) Foreign Application Priority Data

Nov. 17, 2008 (JP) ................... 2008-292960

(51) Int. Cl.
*H05K 5/00* (2006.01)
(52) U.S. Cl. ..................................................... 361/752
(58) Field of Classification Search .............. 361/752, 361/690, 730, 736, 740, 753, 759; 174/521, 174/526, 528, 548, 551
See application file for complete search history.

(56) References Cited

U.S. PATENT DOCUMENTS 7,765,687 B2 * 8/2010 Pitzele et al. ................. 29/841

FOREIGN PATENT DOCUMENTS

| JP | 8-22852 |   | 1/1996 |
| --- | --- | --- | --- |
| JP | 8-293687 | A | 11/1996 |
| JP | 11-176524 | A | 7/1999 |
| JP | 2001-53470 | A | 2/2001 |
| JP | 2006-310610 | A | 11/2006 |

\* cited by examiner

*Primary Examiner* — Jeremy Norris
*Assistant Examiner* — Tremesha S Willis
(74) *Attorney, Agent, or Firm* — Birch, Stewart, Kolasch & Birch, LLP

(57) ABSTRACT

The invention relates to a terminal structure of an electronic component, such as a tuner, in which a printed circuit board 1 on which electronic components including a pin header 2 having a plurality of pin terminals, and a case frame 3 housing the printed circuit board and having a notch opening exposing the pin terminals are provided. A guide hole 23 that penetrates from the upper surface of the pin header 2 to its lower surface in contact with the printed circuit board, and a guide axis 33—insertable into the guide hole 23—provided in a press portion 32 are provided, such that the pin header is held between the press portion 32 provided in the case frame 3 and the printed circuit board, enabling the pin header, even a slim, compact one, having a plurality of pin terminals to be fixed accurately to a predetermined position on the board with a predetermined posture.

8 Claims, 3 Drawing Sheets

TERMINAL STRUCTURE OF AN ELECTRONIC COMPONENT

This application is based on Japanese Patent Application No. 2008-292960 filed on Nov. 17, 2008, the contents of which are hereby incorporated by reference.

BACKGROUND OF THE INVENTION

1. Field of the Invention

The present invention relates to a terminal structure of an electronic component such as a tuner.

2. Description of Related Art

Owing to slim liquid crystal television sets, there are needs for slim, compact electronic devices for incorporation in liquid crystal television sets etc. Incidentally, electronic devices such as tuners have a circuit board, on which various electronic components and electric circuits are mounted, housed in a case, and have pin terminals for external connection projecting outside the case through predetermined holes provided in the case.

To secure connection with external electronic devices and electronic components, the arrangement position of the pin terminals projecting outside the case needs to be accurate, and accordingly a predetermined positional accuracy is required for the circuit board and the case that houses the circuit board. For example, as disclosed in Patent Document (JP-A-8-293687), a proposal has already been made for an electrical product in which an external connection connector mounted on a circuit board is pressed against the circuit board by a press plate to prevent it from lifting up, so that it can be fixed while its proper position and posture are maintained.

Moreover, as disclosed in Patent Document (JP-A-11-176524), a proposal has already been made for a fitting leg and a connector using such a fitting leg, the fitting leg having a shape that allows, when a connector having pin terminals is fitted to a chassis, an engagement part of the fitting leg provided in the connector to be fitted into a fitting hole provided in the chassis without unstableness.

When a pin header having a plurality of pin terminals is mounted on a circuit board, if it is fixed by use of a case, unstableness may occur for the play between the pin header and a press portion of the case, or for the dimension error of the manufactured component.

In particular, the more compact the pin headers are along with the compact devices, the smaller the area on which a pin header is mounted with respect to the circuit board, and thus the fitting posture with respect to the circuit board is unstable. For this reason, a terminal structure of an electronic component is required in which the pin header, even a compact one, is fixed such that its fitting position and fitting posture with respect to the circuit board and the case are accurate, and in which the pin terminals for external connection can be maintained in an accurate position with a correct posture.

SUMMARY OF THE INVENTION

In view of the foregoing, an object of the present invention is to provide a terminal structure of an electronic component in which a pin header, even a slim, compact one, having a plurality of pin terminals can be fixed accurately to a predetermined position on a circuit board with a predetermined posture, and in which a predetermined positional accuracy can be maintained also with respect to a case.

To achieve the above object, the present invention comprises: a pin header that has a plurality of pin terminals at a side of it and includes a guide hole penetrating from its upper surface to its lower surface; a printed circuit board on which electronic components including the pin header are mounted; and a case body that houses the printed circuit board and has a notch opening exposing the pin terminals, and that is provided with a press portion having a guide axis insertable into the guide hole, in which the pin header is held between the press portion and the printed circuit board with the lower surface of the pin header being in contact with the printed circuit board, and with the guide axis inserted into the guide hole.

With this structure, the position of the pin header is fixed with the case frame-side guide axis inserted into the guide hole provided in the pin header; thus, it is possible to prevent the tilting of the pin header, even a slim, compact one, and thereby make the fitting position and fitting posture of the pin header accurate, and to position and fix the pin header accurately with respect to the board and the case frame.

Moreover, according to the invention, in the terminal structure of an electronic component, an insertion hole corresponding to the guide hole is provided in the printed circuit board, and the guide axis has a length large enough to penetrate through the guide hole and the insertion hole. With this structure, arrangement is possible with the case frame-side guide axis penetrating through the pin header and the printed circuit board; thus, it is possible to position and fix the pin header further accurately with respect to the board and the case frame.

Moreover, according to the invention, in the terminal structure of an electronic component, an end part of the guide axis that projects out of the insertion hole is connected to a conductor of the printed circuit board. With this structure, it is possible to enhance assembly strength between the case frame and the printed circuit board. In addition, it is possible to form the guide axis and the case frame from material with good heat and electrical conductions and, by connecting them with the conductor of the board, use the case frame as a heat dissipation conductor or grounding conductor.

Moreover, according to the invention, in the terminal structure of an electronic component, a lengthened portion is provided on the upper surface of the pin header so as to face one or either side of the press portion with respect to the length direction of the pin header, the lengthened portion being close to the press portion. With this structure, even if tilting occurs during fixing of the pin header, the lengthened portion provided on the upper surface of the pin header makes contact with the press portion to serve as a guide, and thus it is possible to control the tilting.

Moreover, according to the invention, in the terminal structure of an electronic component, as the guide hole, a plurality of them are provided in the pin header along its length direction, and the lengthened portion has a width large enough to face the guide axis. With this structure, the pin header, even an elongated one, is pressed down via the press portion with the plurality of places along its length direction serving as a guide; thus, it is possible to fix the pin header without unstableness.

Moreover, according to the invention, in the terminal structure of an electronic component, the lengthened portion is provided to correspond to at least one position where the guide hole is arranged. With this structure, the tilting of the pin header can be prevented also by providing the lengthened portion to correspond to at least part of the press portion.

Moreover, according to the invention, in the terminal structure of an electronic component, an extended portion that extends while keeping contact with the printed circuit board is provided at a lower surface-side side part at one or either side of the pin header with respect to its length direction. With this structure, when the pin header is mounted on the printed circuit board, since the extended portion is provided at a part to make contact with the printed circuit board, the contact area is large; thus, the pin header can be fixed with a correct posture without tilting.

Moreover, according to the invention, in the terminal structure of an electronic component, an extended portion that extends while keeping contact with the printed circuit board is provided at a lower surface-side side part at one or either side of the pin header with respect to its length direction, the extended portion being provided at opposite ends in the length direction of the pin header. With this structure, since the extended portion is provided at a part to make contact with the printed circuit board at opposite ends in the length direction of the pin header, the contact area at the opposite ends is large; thus, the pin header can be fixed with a correct posture without tilting.

BRIEF DESCRIPTION OF THE DRAWINGS

FIG. 1 is a diagram schematically illustrating a terminal structure of an electronic component according to a first embodiment of the present invention, in which

FIG. 2 is a diagram schematically illustrating a terminal structure of an electronic component according to a second embodiment of the present invention, in which FIG. 3 is a diagram schematically illustrating a pin header according to the present invention, in which

DETAILED DESCRIPTION OF PREFERRED EMBODIMENTS

Hereinafter, embodiments of the present invention will be described with reference to the accompanying drawings. Among different embodiments, the same members are identified by common reference signs, and no detailed description of them will be repeated unless necessary. A terminal structure of an electronic component according to the present invention comprises: a pin header that has a plurality of pin terminals at a side of it and includes a guide hole penetrating from its upper surface to its lower surface; a printed circuit board on which electronic components including the pin header are mounted; and a case body that houses the printed circuit board and has a notch opening exposing the pin terminals, and that is provided with a press portion having a guide axis insertable into the guide hole, in which the pin header is held between the press portion and the printed circuit board with the lower surface of the pin header being in contact with the printed circuit board, and with the guide axis inserted into the guide hole.

First, a terminal structure of an electronic component according to a first embodiment will be described with reference to FIG. 1.

Figure 1A:
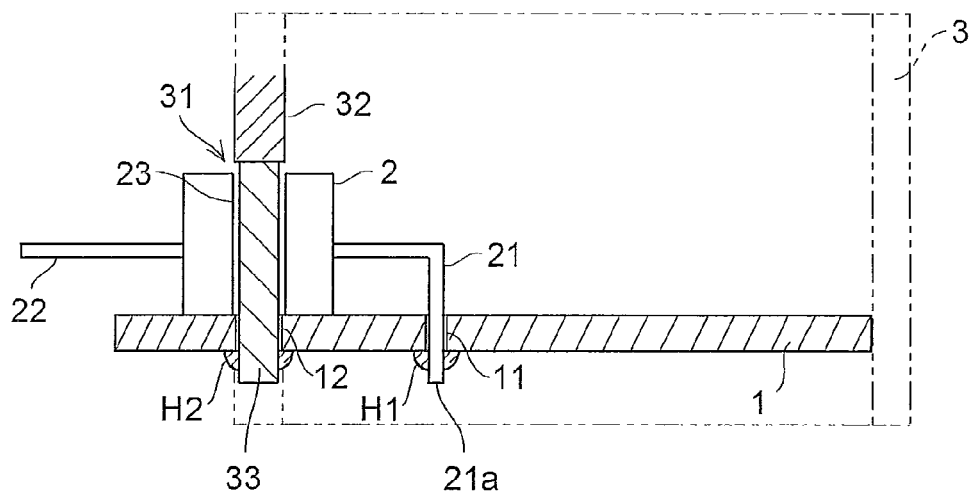
FIG. 1A is a side sectional view.

FIG. 1A shows a terminal structure in which, on mounting an electronic component (for example, a pin header 2) on a printed circuit board 1, an end part 21a of a pin terminal 21, which is bent into an L-shape and provided on one side of the pin header 2, is inserted into a through hole 11 provided in the printed circuit board 1 to penetrate there through and project out of the opposite surface, and is then soldered with a solder H1 to be fixed; a pin terminal 22 provided on the other side is made to project out of a notch opening 31 provided in a side wall of a case frame 3.

To secure connection with external electronic devices and electronic components, the pin terminal 22 projecting out of the case frame 3 needs to be accurately arranged and positioned with a correct posture, and thus accuracy in fixing them to a predetermined position with a predetermined posture with respect to the printed circuit board 1 and the case frame 3 that houses it is required. For this reason, in this embodiment, the pin header 2 is held between the press portion provided in the case frame 3 and the printed circuit board 1, and a guide hole 23 is provided that penetrates from the upper surface of the pin header 2 to its lower surface, which makes contact with the printed circuit board 1, and the press portion 32 is provided with a guide axis 33 insertable into the guide hole 23.

For the press portion 32, as shown in the diagram for example, so long as part of the pin header 2 exposes out through a side wall of the case frame 3, the notch end of the side wall that is provided with the notch opening 31 can be used directly. With this structure, it is possible to press the pin header 2 against the printed circuit board 1 by the press portion 32 to prevent it from lifting up. Moreover, by inserting the guide axis 33 into the guide hole 23 of the pin header 2, it is possible to adjust the pin header 2 to be in a predetermined position with a correct posture with respect to the printed circuit board 1. As described above, in addition to the pin header 2 being pressed against the printed circuit board 1 by the press portion 32 to prevent it from lifting up, the guide axis 33 is inserted through the guide hole 23. This makes it possible to prevent tilting of the pin header 2, and to accurately fix the pin header 2 to a predetermined position with a predetermined posture with respect to the printed circuit board 1 and the case frame 3.

Moreover, the press portion 32 is not limited to the structure in which the side wall part of the case frame 3 is directly used as described above; according to the shape of the case frame 3 and the arrangement position of the pin header 2, the press portion 32 may be provided by elongating part of the side wall part elongated, or be formed by projecting part other than the side wall. In any case, on attaching the case frame 3 to the printed circuit board 1, so long as the pin header 2 body, formed of resin, can be pressed against the printed circuit board 1, there is no particular restriction.

Figure 1B:
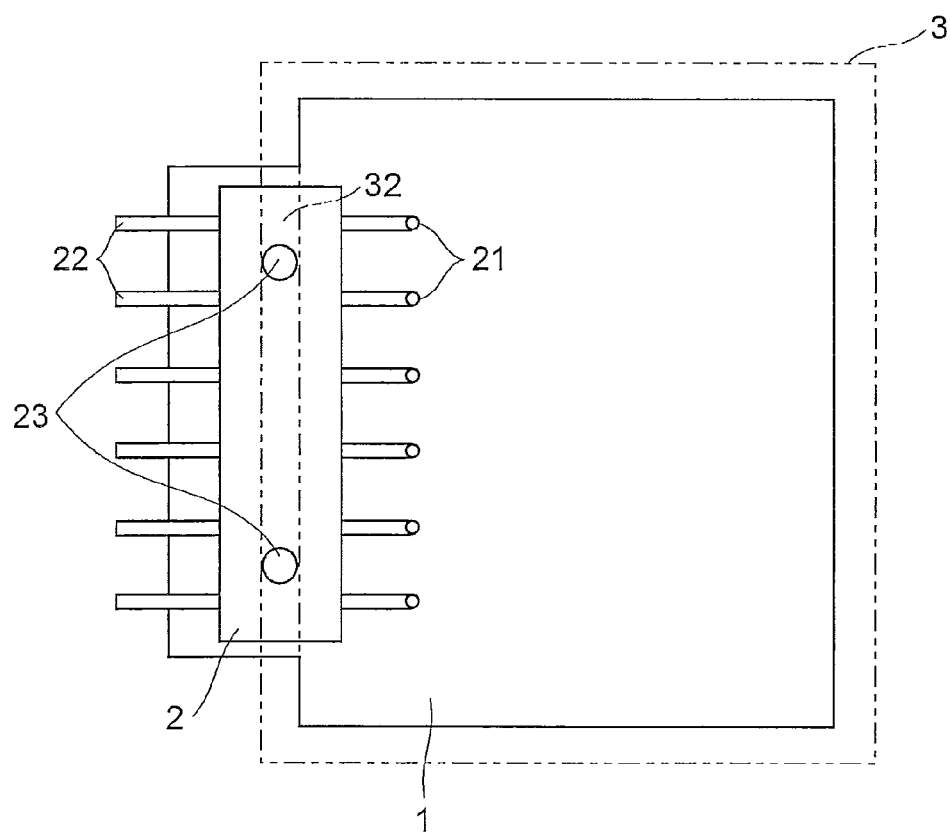
FIG. 1B is a plan view.

As shown in FIG. 1B, when the pin header 2 has a plurality of pin terminals 21 and 22 and has an elongated shape, it is preferable that the guide hole 23 and the guide axis 33 be provided in a plurality of places in the length direction of the pin header 2, for example in two places, one at each of the opposite ends. With this structure, the opposite ends of the elongated pin header 2 are fixed at the same time with a correct posture, and thus it is possible to further prevent the tilting of the pin header 2 effectively. In addition, the guide axis 33 can be formed by elongating part of the press portion 32 or attaching a new axis member to a predetermined part of the press portion 32.

To allow the case frame 3-side guide axis 33 to be freely inserted into the pin header 2-side guide hole 23, the guide axis 33 may have a shape slightly smaller than the guide hole 23. Moreover, to facilitate manufacturing, it is preferable that the guide hole 23 be a circular hole with a predetermined diameter and the guide axis 33 be a circular axis having a diameter slightly smaller than that of the circular hole.

Figure 3A:
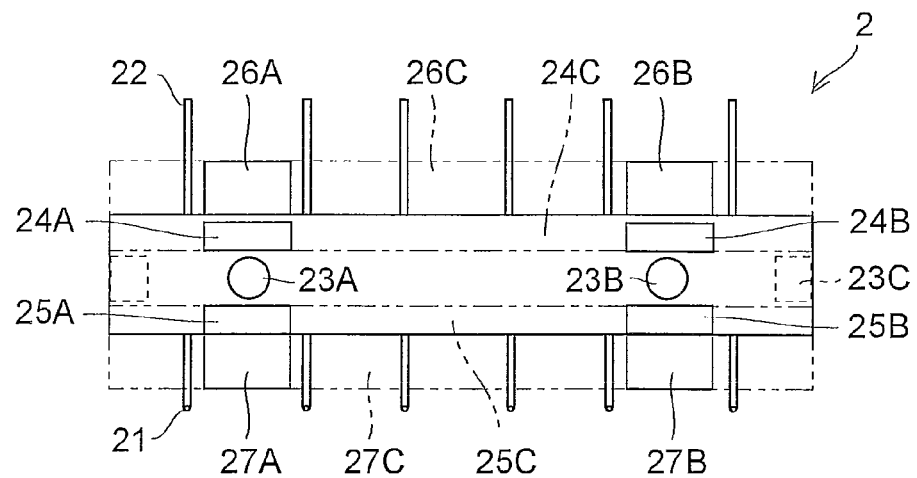
FIG. 3A is a plan view.

The guide hole 23 may be formed in an end part of the pin header 2, in which case the hole can be not circular but semicircular, or be half-square guide hole 23C as shown in FIG. 3A.

An insertion hole 12 corresponding to the guide hole 23 is provided in the printed circuit board 1, and the guide axis 33 has a length large enough to penetrate through the guide hole 23 and the insertion hole 12. With this structure, the guide axis 33 is arranged to penetrate through the pin header 2 and the printed circuit board 1, and thus it is possible to adjust the posture of the pin header 2 to be correct further accurately with respect to the printed circuit board 1, and to position and fix the pin header 2 further accurately with respect to the printed circuit board 1 and the case frame 3.

The end part of the guide axis 33 penetrating the printed circuit board 1 and projecting therebelow can be connected to a conductor of the printed circuit board 1. As described above, when the guide axis 33 is connected to the printed circuit board 1, the case frame 3 and the printed circuit board 1 are fixed together, enhancing assembly strength between the printed circuit board 1 and the case frame 3. Here, it is possible to form the guide axis 33 and the case frame 3 from material with good heat and electrical conductions and, by connecting them with the conductor of the board with the solder H2, use the case frame 3 as a heat dissipation conductor or grounding conductor.

As described above, the arrangement position and posture of the pin header 2 can be maintained within a predetermined accuracy by inserting the guide axis 33 through the guide hole 23 and pressing the pin header 2, via the press portion 32, against the printed circuit board 1.

However, even with this structure, the pin header 2 may tilt for the play between the guide hole 23 and the guide axis 33, in which case positioning and fixing with high accuracy may be difficult.

Next, a terminal structure of an electronic component according to a second embodiment that allows further accurate positioning and fixing will be described with reference to FIGS. 2 and 3.

Figure 2A:
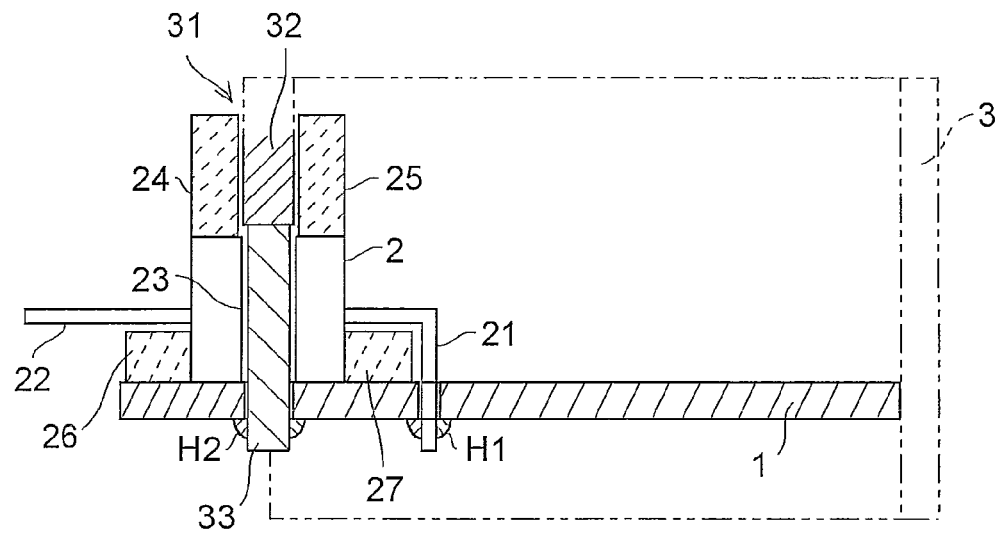
FIG. 2A is a side sectional view.
Figure 2B:
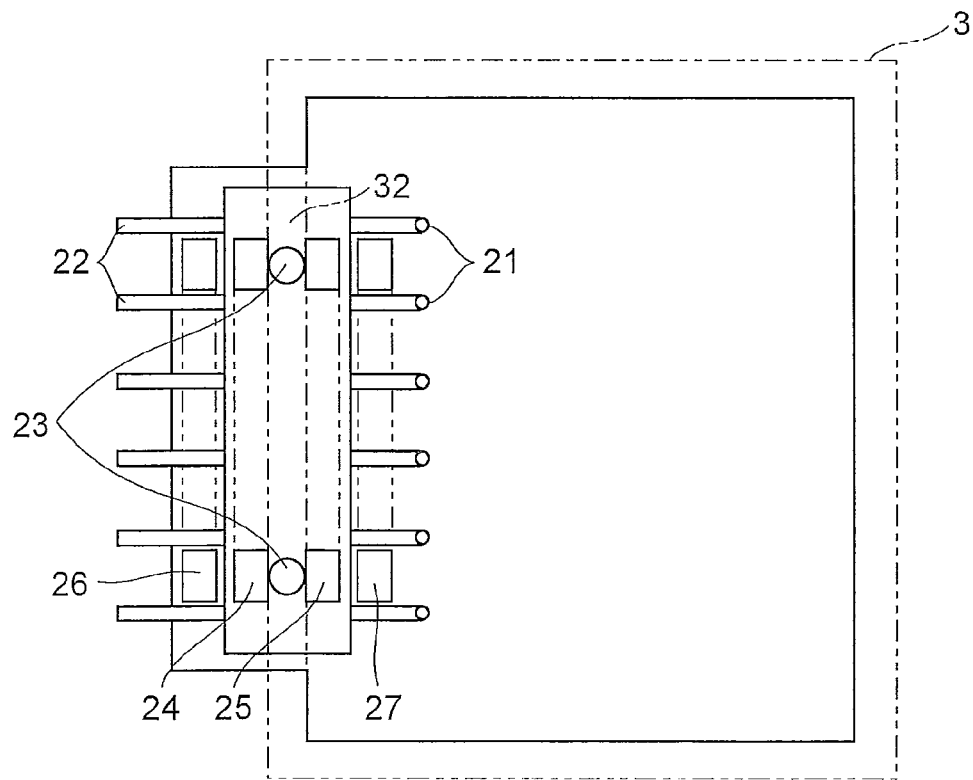
FIG. 2B is a plan view.

As shown in FIGS. 2A and 2B, compared with the terminal structure of an electronic component according to the first embodiment, that according to the second embodiment differs in that lengthened portions 24 and 25 and extended portions 26 and 27 of which all serve as a supporting guide portion—for preventing the tilting of the pin header 2 further accurately are additionally provided.

The tilting of the pin header 2 can be prevented, for example, by providing the lengthened portion 24 or/and 25 on the upper surface of the pin header 2 so as to face one or either side of the press portion 32 with respect to the length direction of the pin header, the lengthened portion being close to the press portion 32. The lengthened portions 24 and 25 may have a shape and be of any number so long as they exhibit, when the pin header 2 is tilted, an adjustment function for adjusting the tilted posture of the pin header 2 to be correct by making contact with the press portion 32; the lengthened portions 24 and 25 each can be provided on the upper surface of the pin header 2 along all or part of in its length.

When as the guide hole 23, a plurality of them are provided in the pin header 2 in its length direction, the lengthened portions 24 and 25 can each be provided at a plurality of places facing a plurality of guide axes 33 that are provided to correspond to the guide holes 23. When the lengthened portions are provided at the plurality of places facing the plurality of guide axes 33, the pin header 2, even an elongated one, is pressed down via the press portion 32 with the plurality of places in its length direction serving as a guide; thus, it is possible to fix, while maintaining the correct posture of, the pin header 2 without unstableness. Moreover, the tilting of the pin header 2 can be prevented to a certain degree also by providing the lengthened portions 24 and 25 to correspond to at least a part of the area corresponding to the guide axes 33.

As described above, the lengthened portions 24 and 25 each may be one long piece, over in the length direction of the pin header 2, as indicated by a phantom line in FIG. 2B, or be one or plurality of short pieces, over in the length direction, as indicated by a solid line in the figure. For example, as shown in FIG. 3A, it is possible to provide guide holes 23A and 23B in two places, one at each of the opposite ends, in the length direction of the pin header 2, and to provide rectangular lengthened portions 24A and/or 24B at one of the sides of the pin header 2 in its length direction sandwiching the guide holes. Moreover, it is also possible to provide the lengthened portions 24A and 25A to face the guide hole 23A in one place, or to provide both of the lengthened portions 24A and 25A and the lengthened portions 24B and 25B to face the guide holes 23A and 23B in two places, respectively.

Figure 3B:
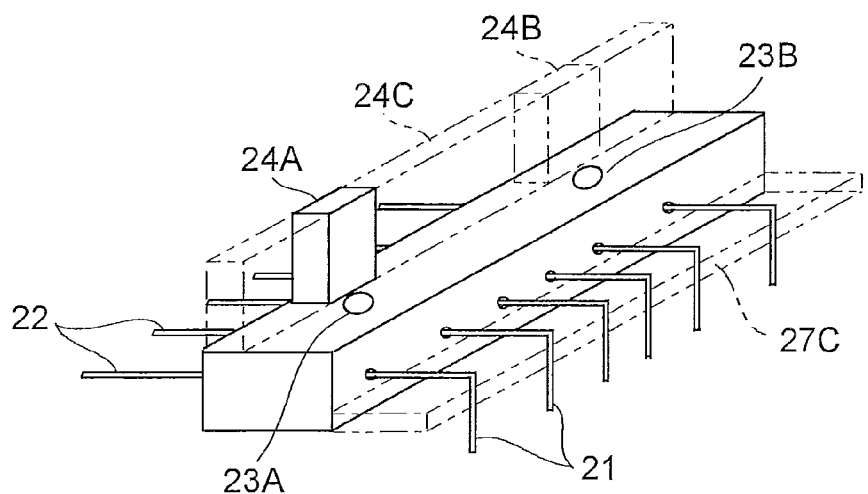
FIG. 3B is a perspective view.

Preferably, the short rectangular lengthened portion 24A has a size (width) larger than the diameter of the guide axis, and thus it has a width large enough to face the guide hole 23 (the guide axis 33) as shown in FIGS. 3A and 3B. The height (elongated length) of the lengthened portion 24A is preferably a height that does not make contact with a cover (unillustrated) placed above the case frame. It is also possible to provide, over in the length direction of the pin header 2, one long lengthened portion 24C or 25C having a dam shape.

Extended portions 26 and 27 are extended portions that are provided at lower surface-side side parts at either side of the pin header 2 with respect to its length direction, so as to form a seating surface for the pin header 2 to make contact with the printed circuit board 1 to enable accurate arrangement of the slim, compact pin header 2 without unstableness. Like the lengthened portions 24 and 25, the extended portions 26 and 27 each may be one long piece over in the length direction of the pin header 2, or be one or a plurality of short pieces over in the length direction. That is, as shown in the diagram, it is possible to use short extended portions 26A, 26B, 27A, and 27B as one piece or in combination, or use one long extended portion 26C or 27C.

As seen in the diagram, the extended portion 27 (27A, 27B, and 27C) provided on the pin terminal 21 side, that is bent into an L-shape, has the maxim extending length to make contact with the pin terminal 21. In addition, the extended portion 26 (26A, 26B, and 26C) provided on the pin terminal 22 side, that is projecting outward, has a length that do not make contact with a side wall of the case frame.

With the structure provided with the lengthened portions 24 and 25, these lengthened portions provided on the upper surface of the pin header 2 make contact with the press portion 32 and the guide axis 23 to serve as a guide; thus, it is possible to place and fix the pin header 2 on the printed circuit board 1 without tilting.

With the structure provided with the extended portions 26 and 27, when the pin header 2 is mounted on the printed circuit board 1, the area to make contact with the printed circuit board 1 is large, and thus the pin header 2 can be fixed with a correct posture without tilting. For this reason, variations in fitting accuracy due to compact pin headers 2 can be absorbed, and thus there is no hindering in achieving compact, slim electronic devices such as tuners.

As described above, with the terminal structure provided with the lengthened portions 24 and 25 and the extended portions 26 and 27, the pin header 2 can be fixed to a correct position with a correct posture. For this reason, the terminal structure enables the pin terminals 22 projecting from the pin header 2 to outside the case frame 3 to be placed in a predetermined correct position in a correct direction.

As the lengthened portions, which of the lengthened portions 24A, 24B, 24C, 25A, 25B, and 25C to select, and how long to extend them can be determined through proper selection and combination according to the sizes of the printed circuit board 1, pin header 2, and the case frame 3 and the resulting gaps and margins when they are combined.

The same applies with the extended portions, as which of the extended portions 26A, 26B, 26C, 27A, 27B, and 27C to select, and how long to extend them.

As described above, according to the present invention, the pin header is held between the press portion provided in the case frame and the printed circuit board, and in addition the position of the pin header is fixed with the case frame-side guide axis inserted into the guide hole provided in the pin header; thus, it is possible to prevent the tilting of the pin header and to position and fix the pin header accurately with respect to the board and the case frame.

Moreover, with the terminal structure having the lengthened portions provided on top of the pin header and the extended portions provided at its lower part, it is possible to fix the pin header, even a slim, compact one, to a correct position with a correct posture with respect to the press portion provided in the case frame. For this reason, the terminal structure of an electronic component enables the pin terminals projecting from the pin header to outside the case frame to be placed in a predetermined correct position in a correct direction.

Further, the end part of the guide axis penetrating the printed circuit board and projecting therebelow is connected to the conductor of the printed circuit board. This makes it possible to enhance the assembly strength between the printed circuit board and the case frame. In addition, the case frame can be used as a heat dissipation conductor or a grounding conductor.

As described above, according to the present invention, it is possible to fix the pin header with a correct position and posture by inserting the case frame-side guide axis into the guide hole provided in the pin header. Moreover, it is possible to obtain the terminal structure of an electronic component that enables the pin header, even a slim, compact one, to be fixed accurately with respect to the board and the case frame without unstableness.

The terminal structure of an electronic component according to the present invention can therefore be used suitably in a terminal structure in which a circuit board on which various electronic components and electronic circuits are mounted is housed in a case, and pin terminals for external connection project outside of the case through predetermined notch openings provided in the case.

What is claimed is:

1. A terminal structure of an electronic component comprising:
   a pin header having a plurality of pin terminals at a side thereof and having a guide hole penetrating from an upper surface to a lower surface thereof;
   a printed circuit board on which electronic components including the pin header are mounted; and
   a case body that houses the printed circuit board and has a notch opening exposing the pin terminals, the case body being provided with a press portion provided at a side of the case body so as to extend in the direction toward the printed circuit board and having a guide axis insertable into the guide hole,
   wherein the pin header is held between the press portion and the printed circuit board with the lower surface of the pin header being in contact with the printed circuit board, and with the guide axis inserted into the guide hole.

2. The terminal structure of an electronic component according to claim 1,
   wherein an insertion hole corresponding to the guide hole is provided in the printed circuit board, and the guide axis has a length large enough to penetrate through the guide hole and the insertion hole.

3. The terminal structure of an electronic component according to claim 2,
   wherein an end part of the guide axis that projects out of the insertion hole is connected to a conductor of the printed circuit board.

4. The terminal structure of an electronic component according to claim 1,
   wherein a lengthened portion is provided on an upper surface of the pin header so as to face one or either side of the press portion with respect to a length direction of the pin header, the lengthened portion being close to the press portion.

5. The terminal structure of an electronic component according to claim 4,
   wherein as the guide hole, a plurality of guide holes are provided in the pin header in the length direction thereof, and the lengthened portion has a width large enough to face the guide axis.

6. The terminal structure of an electronic component according to claim 5,
   wherein the lengthened portion is provided to correspond to at least one position where the guide hole is arranged.

7. The terminal structure of an electronic component according to claim 1,
   wherein an extended portion that extends while keeping contact with the printed circuit board is provided at a lower surface-side side part at one or either side of the pin header with respect to the length direction thereof.

8. The terminal structure of an electronic component according to claim 1,
   wherein an extended portion that extends while keeping contact with the printed circuit board is provided at a lower surface-side side part at one or either side of the pin header with respect to the length direction thereof, the extended portion being provided at opposite ends of the pin header.

* * * * *